United States Patent [19]

Nishiura et al.

[11] Patent Number: 5,043,781
[45] Date of Patent: Aug. 27, 1991

[54] SEMICONDUCTOR DEVICE

[75] Inventors: Masaharu Nishiura; Tatsuhiko Fujihira, both of Kanagawa, Japan

[73] Assignee: Fuji Electric Co., Ltd., Kanagawa, Japan

[21] Appl. No.: 561,982

[22] Filed: Aug. 1, 1990

[30] Foreign Application Priority Data

Aug. 3, 1989 [JP] Japan .................. 1-201802
Oct. 13, 1989 [JP] Japan .................. 1-266543
Mar. 20, 1990 [JP] Japan .................. 2-71213
Apr. 19, 1990 [JP] Japan .................. 2-104011

[51] Int. Cl.$^5$ .................... H01L 29/78; H01L 21/22
[52] U.S. Cl. .................... 357/23.6; 357/13; 357/23.4; 357/23.14; 357/41; 357/51; 357/52; 357/53; 437/141; 437/904; 437/913; 437/919

[58] Field of Search .................. 357/13, 23.4, 23.6, 357/23.14, 41, 51, 52, 53; 437/141, 904, 913, 919

[56] References Cited

U.S. PATENT DOCUMENTS 4,929,989  5/1990  Hayano .................. 357/23.6

Primary Examiner—Edward J. Wojciechowicz
Attorney, Agent, or Firm—Finnegan, Henderson, Farabow, Garrett and Dunner

[57] ABSTRACT

A MOS type semiconductor device including capacitors connected in series between the source electrode and the peripheral electrode. Alternately, a MOS type semiconductor device including constant voltage diodes connected in series between the source electrode and the peripheral electrode.

13 Claims, 12 Drawing Sheets

SEMICONDUCTOR DEVICE

BACKGROUND OF THE INVENTION

1. Field of the Invention

The present invention relates to a MOS type semiconductor device, such as a power vertical MOSFET or a insulated gate bipolar transistor (IGBT), (also referred to as an IGT or COMFET).

2. Description of the Related Art

FIG. 2 is a section view showing the structure of a conventional power vertical MOSFET. A silicon substrate is prepared by forming an N⁻ drain layer 1 on an N⁺ drain layer 2. A P type base layer 3 is then formed on the surface of the N⁻ drain layer 1. A P⁺ diffusion layer 4 is formed in the central portion of the P type base layer 3 to a depth reaching the N⁻ layer 1. A P⁺ diffusion layer 5 is formed in the surface of the P type base layer 3.

N⁺ source regions 6 are formed in the P type base layer 3 in such a manner as to leave a section of layer 3 between the N⁺ source region 6 and the N⁻ drain layer 1. The section of the P type base layer 3 which is located between the source region 6 and the N⁻ drain layer 1 serves as a channel forming region 7. A gate electrode 9 of polycrystalline silicon is formed in a gate insulating film 81 over the channel forming region 7. A source electrode 10 is provided in an insulating film 82 over the gate electrode 9 in such a manner that the source electrode 10 is in contact with the P⁺ layers 4 and 5 and the source layer 6 through an opening formed in the insulating film 82.

The right half of FIG. 2 shows the voltage withstanding structure of the end portion of the MOSFET in which a plurality of base layers 3 are formed in the substrate. The gate electrode 9 and the source electrode 10 are extended in the insulating film 83 towards the end portion, thus forming field plates. A guard ring provided as P⁺ layer 41, is formed near the end portion to surround the plurality of base layers 3. The P⁺ layer 41 is in contact with a peripheral electrode 12 which is equal in potential to a drain electrode 11. The strain produced by cutting the silicon substrate makes the side of the substrate low in resistance. Therefore, the peripheral electrode 12 is equal in potential to the drain electrode 11 without a connecting conductor. The electrode 12 is connected to a gate electrode 91. A wiring electrode 13 is formed on an insulating film 84 over the electrodes 10 and 12.

As is seen from FIG. 3, the wiring electrode 13 is a single line for interfacing to a MOSFET controlling IC 32 which is formed on the same silicon substrate as a MOSFET 31. The signal line is connected to the gate electrode 9 of the MOSFET. When a voltage that is positive with respect to the source electrode 10 is applied to the gate electrode 9, a channel is formed in the channel forming region 7 of the P type base layer 3 below the gate insulating film 81. As a result, electrons are injected into the drain layers 1 and 2 through the channel. The transistor is, thus, rendered conductive. When the gate electrode 9 is made equal in potential to the source electrode 10, or negatively biased, the transistor is rendered non-conductive. As such, the transistor functions as a switching element. If the potential of the drain electrode 11 is higher than the potential of the source electrode 10, the conductivity of the surface layer of the N⁻ drain layer 1 below the source electrode 10 may be converted into a P type conductivity. However, the conductivity of the surface layer below the electrode 12 is equal in potential to the drain electrode 11 and remains N type. Thus, a developing layer is allowed to extend towards the P+ layer 41, thereby preventing breakdown of the elements, eliminating adverse effects of the substrate end portion, and stabilizing the device.

FIG. 4 shows a conventional IGBT (insulated gate bipolar transistor). In FIG. 4, those parts which have been previously described with reference to FIG. 2 are designated by the same reference numerals. A P+, drain layer 20 is shown in FIG. 4. The N⁻ layer 2 between the N⁻ layer 1 and P+ layer 20 is a buffer layer. When electrons are injected from the N+ source region 6 into the P+ drain layer 20 through the channel forming region 7, the N⁻ layer 1, and the N³⁰ buffer region 2, holes are injected from the P+ drain layer 20 through the N+ buffer layer 2 into the N⁻ layer 1. As a result, conductivity modulation occurs in the N⁻ layer 1 such that the resistance becomes low.

Several problems are apparent in the operation of conventional MOS type semiconductor devices such as described above. FIG. 5 shows the surface region of the end portion of a MOSFET or an IGBT which is near the guard ring. In FIG. 5, those parts which have been previously described with reference to FIGS. 2 and 3 are designated by the same reference numerals. Since the insulating film 83 is interposed between the N⁻ layer 1 of the silicon substrate and the signal line 13 which extends from above the source layer 3 to above the guard ring, a capacitance 14 is developed between the surface of the silicon substrate and the signal line. As the signal level of the signal line 13 changes, the potential of the surface becomes unstable because of the presence of this capacitance 14. As a result, performance of the device depends on the presence or absence of a potential on the signal line 13.

In an attempt to reduce capacitance 14, the thickness of the insulating film 83 can be increased. However, this method was not proved very effective. Another method for reducing capacitance 14 is shown in FIG. 6. After electrodes 10 and 12 are formed, a resistive film 15 (e.g., an amorphous silicon film) is formed to bridge electrodes 10 and 12. This second method is also disadvantageous. The amorphous silicon film 15, formed by an electron beam vacuum deposition, is low in film resistance control stability, and its formation increases the number of manufacturing steps by requiring a film forming step and a photolithograph step.

FIG. 7 shows a circuit with the MOSFET 71, such as shown in FIG. 2, driving an inductive load L. The case is considered in which the FET 71 is turned ON to energize the inductive load L, such as a motor or relay, and is then turned OFF. When this occurs, it is sometimes possible for a parasitic bipolar transistor made up of the N+ source layer 6, P type base layer 3 and N⁻ layer 1 of the MOSFET 71 to be turned ON. This results in the breakdown of the device. This phenomenon is described in detail with reference to FIG. 8.

Referring to FIG. 8, when the MOSFET is turned OFF with the inductive load connected thereto, depletion layers 32 are formed on both sides of the PN junction 31 of the FET. Some of the discharged carriers flow as a hole current 33 through the P type base layer 3 located under the N+ source layer 6. The surface of the P type base layer 3 is connected through the source electrode 10 to the N+ source layer 6, so that a potential difference, which is the product of the hole current 33 and the base resistance Rb, is created between the source layer 6 and the base layer 3. If the potential difference exceeds the base/source built-in voltage, then electrons are injected from the source 6, the parasitic bipolar transistor is turned ON, and the device suffers breakdown.

An object of the formation of the P+ diffusion layer 4 in FIG. 2 is to decease the hole current 33 flowing below the N+ source layer 6 and thereby prevent breakdown of the device when the parasitic transistor is turned ON. An object of the formation of the P+ low resistance layer 5 is to decease the base resistance Rb and thereby prevent breakdown of the device by preventing the parasitic transistor from turning ON. However, even with use of these methods, when the drain voltage increases, breakdown occurs at location 34 of the P diffusion layer 3, and great numbers of holes and electrons are formed. As a result, the turn OFF performance of the power MOSFET is insufficient when used with an inductive load.

Similarly, when the IGBT is turned OFF a parasitic bipolar transistor made up of the N+ source layer 6, P type base layer 3 and N- layer 1 of the MOSFET 71 is turned ON, resulting in the breakdown of the device. Furthermore, even when the IGBT is "ON", there is a hole current flow 33 below the N+ region 6. Thus, the IGBT suffers from a difficulty that, even when it is turned OFF with a non-inductive load, or when it is "ON", the parasitic transistor is turned ON, thus resulting in the breakdown of the device. As with the power MOSFET, an effort has been made to eliminate this difficulty in the IGBT by formation of the P+ diffusion layer 4 and the P+ low resistance layer 5. However, the difficulty has not been completely eliminated.

SUMMARY OF THE INVENTION

An object of this invention is to provide a MOSFET semiconductor device in which the effects of the signal line connected on the surface to the controlling IC are eliminated while performance remains substantially unchanged. Another object of the invention is to provide a MOS type semiconductor device wherein, as the drain voltage increases, a parasitic transistor is prevented from being turned ON, so that the MOS type semiconductor device has a high turn OFF capacity.

The foregoing objects have been achieved by a MOS type semiconductor device having a semiconductor substrate including a first conductivity type semiconductor layer, a plurality of second conductivity type base layers selectively formed in a surface portion of the first conductivity type semiconductor substrate layer. a first conductivity type source layer selectively formed in a surface portion of the base layers, a gate insulating film formed over at least a portion of each base layer, a gate electrode formed on the gate insulating film, a channel formed in a portion of the base layer beneath the gate electrode and between the source layer and the first conductivity type semiconductor substrate layer, a second conductivity type guard ring layer formed in the first conductivity type semiconductor substrate layer and disposed to surround the base layers, a source electrode formed on the surface of the first conductivity type semiconductor substrate layer and in contact with the base layer and the source layer, a peripheral electrode formed on the surface of the first conductivity type semiconductor substrate layer and in contact with the guard ring layer, a drain electrode formed on an opposite surface of the semiconductor substrate to have a potential substantially equal to that of the peripheral electrode, a plurality of second conductivity type layers formed in the surface of the first conductivity type semiconductor substrate layer between the source layer and the guard ring layer, a plurality of bridging insulating film portions each formed over the portion of the first conductivity type semiconductor substrate layer between adjacent ones of the second conductivity type layers and overlapping at least portions of the adjacent second conductivity type layers, a plurality of connecting electrodes respectively formed over the bridging insulating film portion, and a capacitance associated with each portion of each bridging insulating film portion that overlaps one of the second conductivity type layers, the capacitances being connected in series between the source electrode and the peripheral electrode by the plurality of connecting electrodes.

BRIEF DESCRIPTION OF THE DRAWINGS

The accompanying drawings, which are incorporated in and constitute part of the specification, illustrate a presently preferred embodiment of the invention, and together with the general description given above and the detailed description of the preferred embodiment given below, serve to explain the principals of the invention.

DESCRIPTION OF THE PREFERRED EMBODIMENT

A preferred embodiment of the present invention will be described with reference to the accompanying drawings.

Figure 1A:
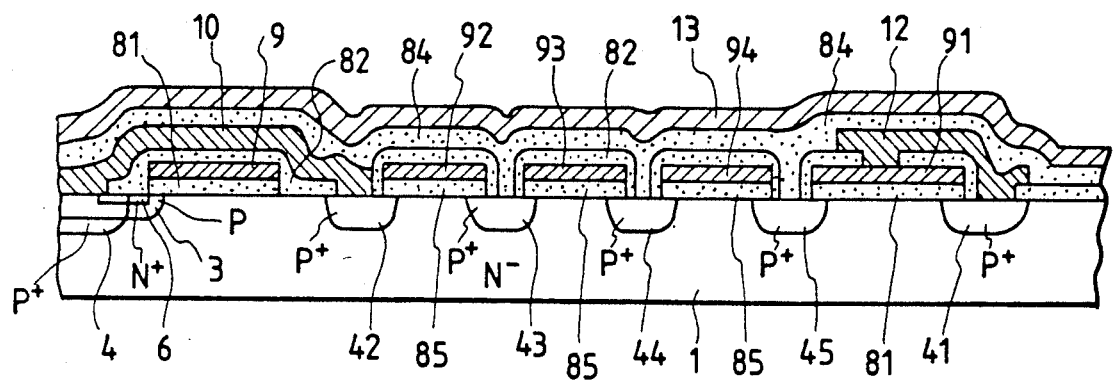
FIG. 1(a) is a sectional view of a MOS type semiconductor device which is a first embodiment of the present invention.
Figure 2:
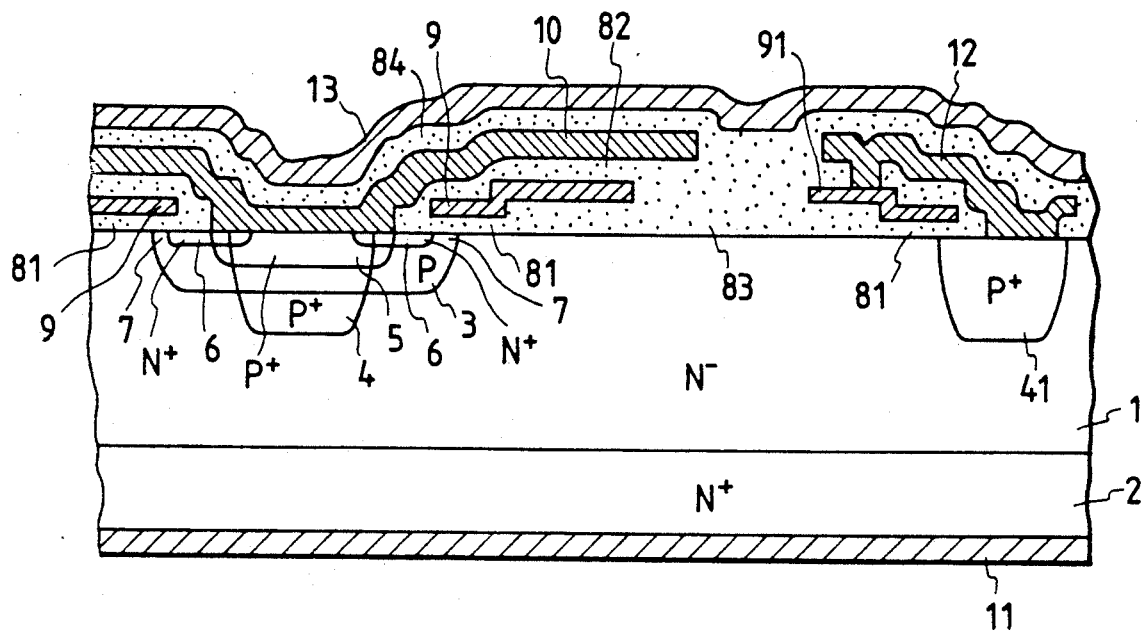
FIG. 2 is a sectional view of the peripheral portion of a conventional vertical MOSFET.
Figure 3:
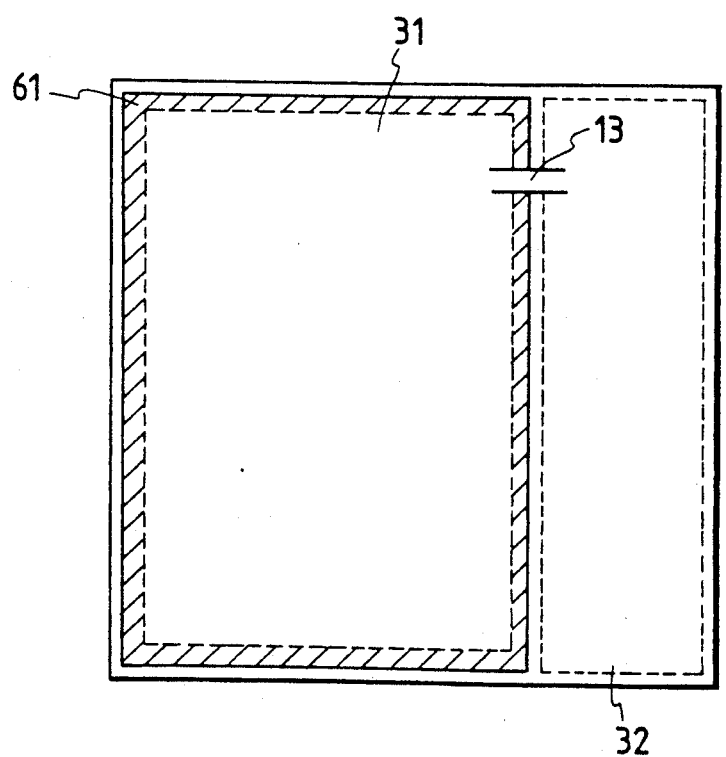
FIG. 3 is a plan view of a semiconductor substrate integrating the vertical MOSFET and a controlling IC.
Figure 4:
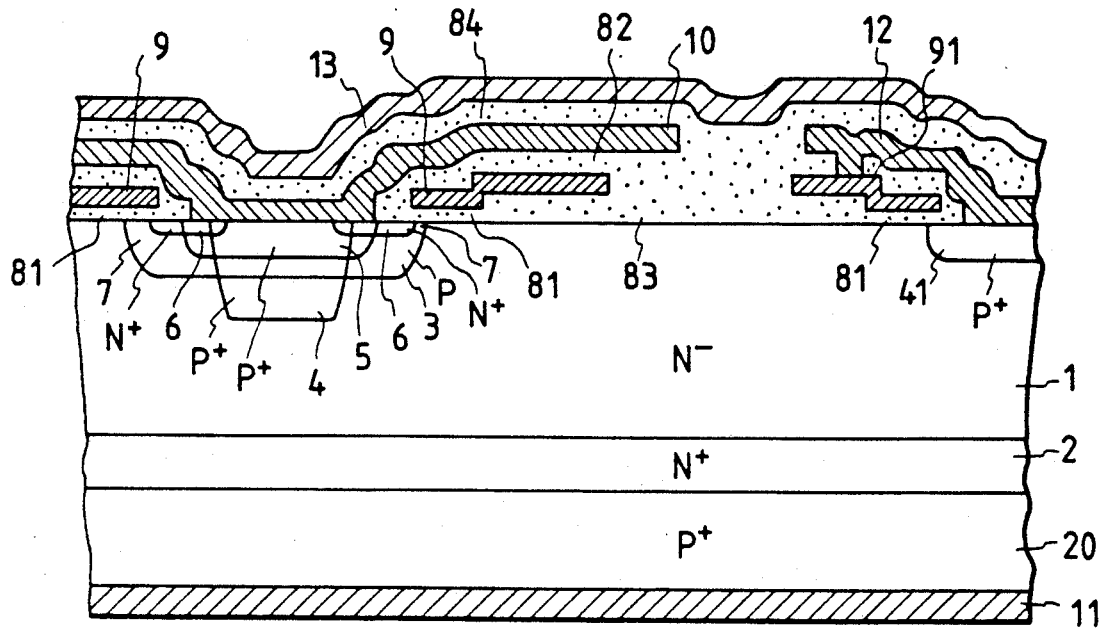
FIG. 4 is a sectional view of the peripheral portion of a conventional IGBT.
Figure 5:
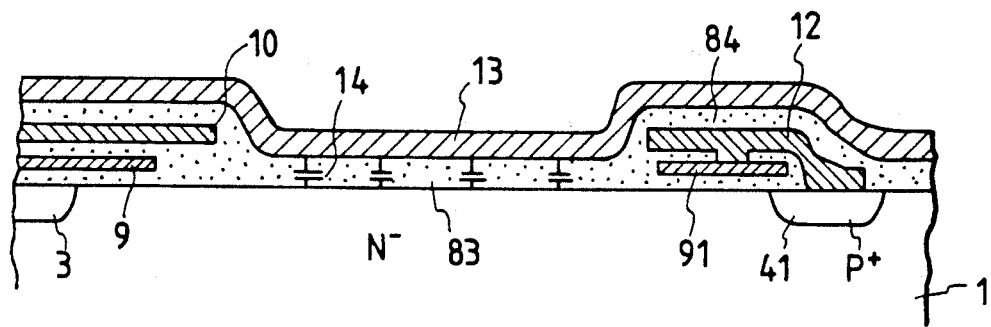
FIG. 5 is a sectional view of the surface portion of the conventional MOS type semiconductor device.
Figure 6:
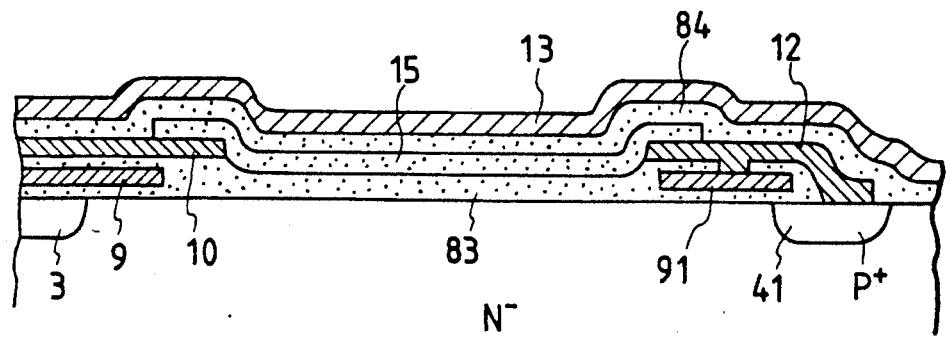
FIG. 6 is a sectional view of the surface portion of another example of the conventional MOS type semiconductor device.
Figure 7:
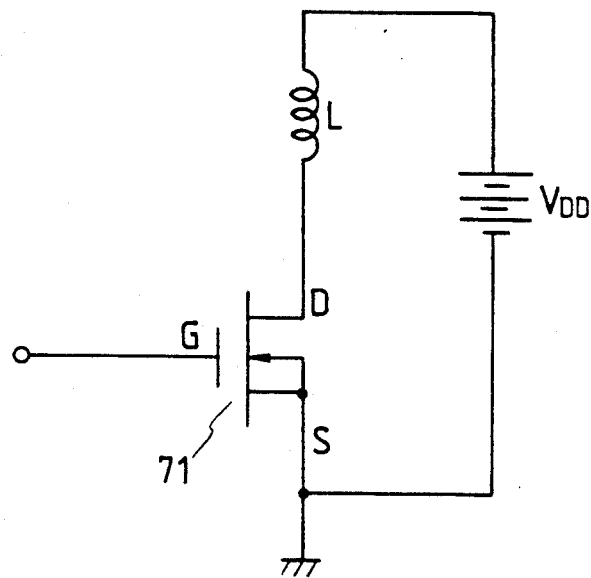
FIG. 7 is a circuit diagram of a circuit for driving an inductive load with a MOSFET.
Figure 8:
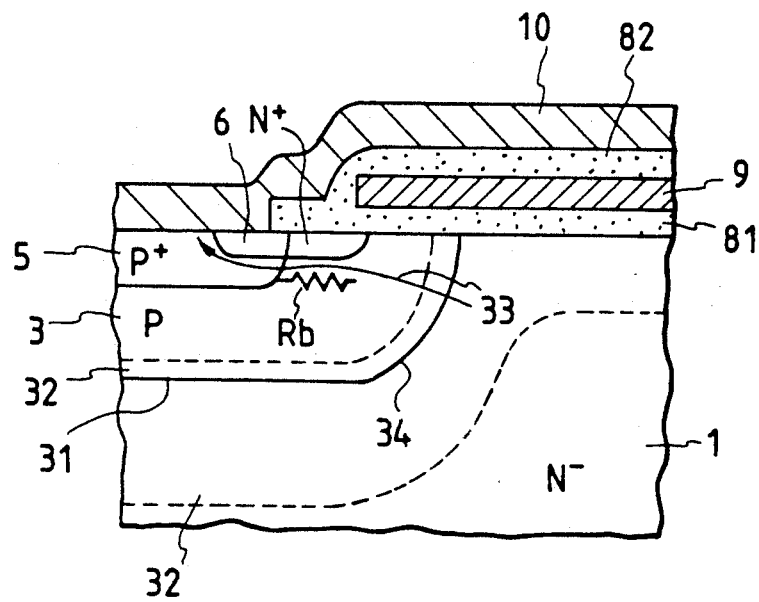
FIG. 8 is a diagram for illustrating the manner in which damage occurs when an inductive load is driven with a MOSFET.

FIG. 1(a) shows the surface structure of a vertical MOSFET or IGBT according to a first embodiment of the present invention. Those parts which have been previously described with reference to FIG. 2 are designated by the same reference numerals.

Figure 1B:
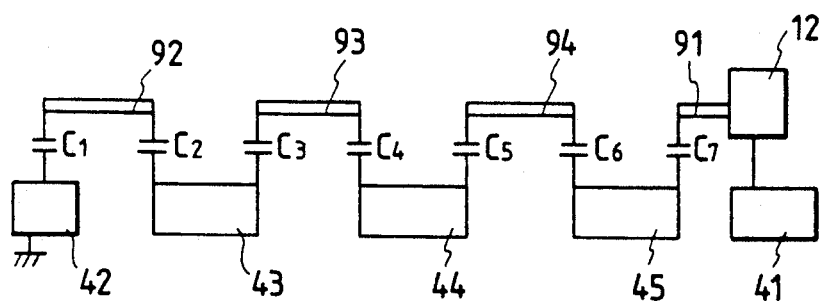
FIG. 1(b) is an equivalent circuit of the MOS type semiconductor device of the first embodiment.

As shown in FIG. 1(a), a plurality (four in this case) of P+ layers 42, 43, 44 and 45 are formed in the surface region of the N− layer between the base layer 3 and the guard ring 41. Connecting electrodes 92, 93 and 94 of polycrystalline silicon are formed over an insulating film 85 in the regions between the P+ layers 42, 43, 44 and 45, respectively. The connecting electrodes 92, 93 and 94 are covered with insulating films 82. A signal line 13 is disposed over an insulating film 84 over the source layer 6 and the guard ring layer 41. FIG. 1(b) shows an equivalent circuit of the device shown in FIG. 1(a). Like parts of FIGS. 1(a) and 1(b) are designated by like reference numerals. Both ends of the connecting electrode 92 are connected to the P+ layers 42 and 43, respectively, this forming capacitors $C_1$ and $C_2$. Similarly, the connecting electrode 93 forms capacitors $C_3$ and $C_4$, the connecting electrode 94 forms capacitors $C_5$ and $C_6$, and the electrode 91 forms a capacitor $C_7$. These capacitors are series-connected between the source electrode 10 and the peripheral electrode 12 through the P+ layers and the connecting electrodes.

FIGS. 9(a) through 9(e) show the steps of forming the surface structure of the above-described semiconductor device of the first embodiment. In FIGS. 9(a)–9(e), like parts which have been described with reference to FIG. 1 are designated with the same reference numerals.

Figure 9A:
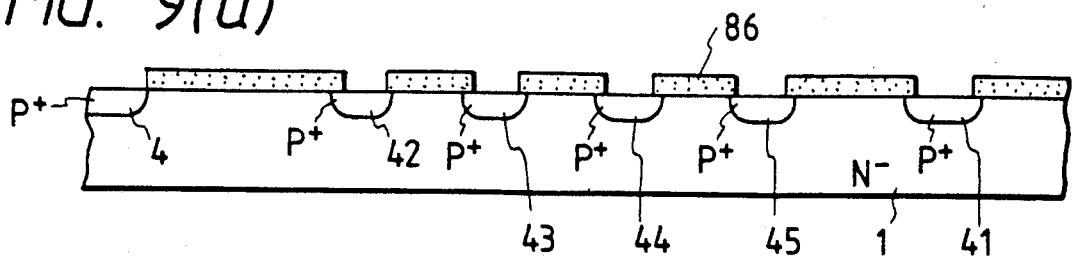
FIGS. 9(a) through 9(e) are sectional views showing a method of manufacturing the MOS type semiconductor device shown in FIG. 1.
Figure 9B:
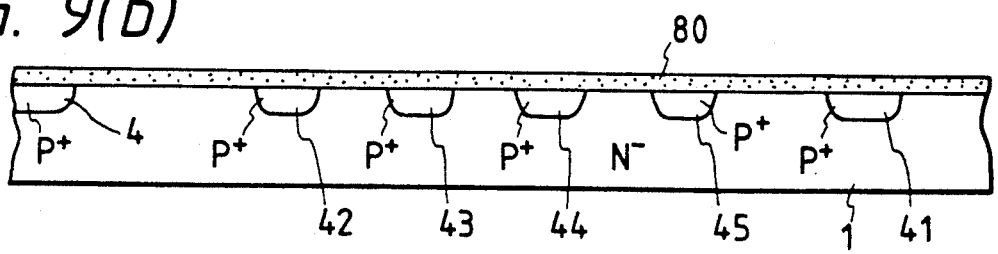
Figure 9C:
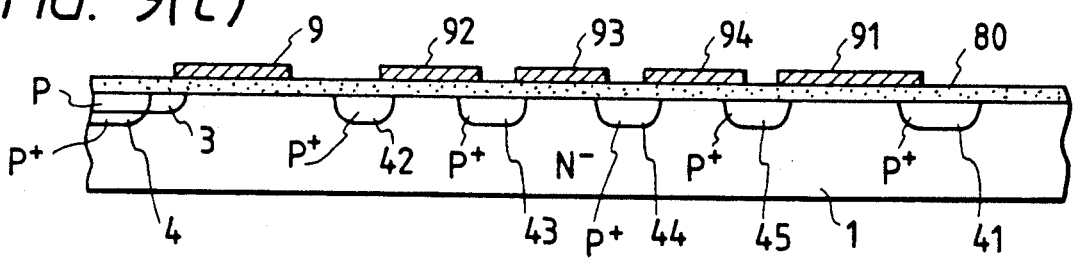
Figure 9D:
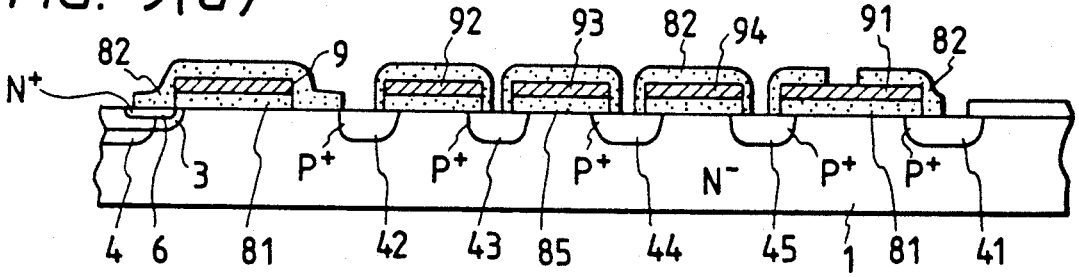
Figure 9E:
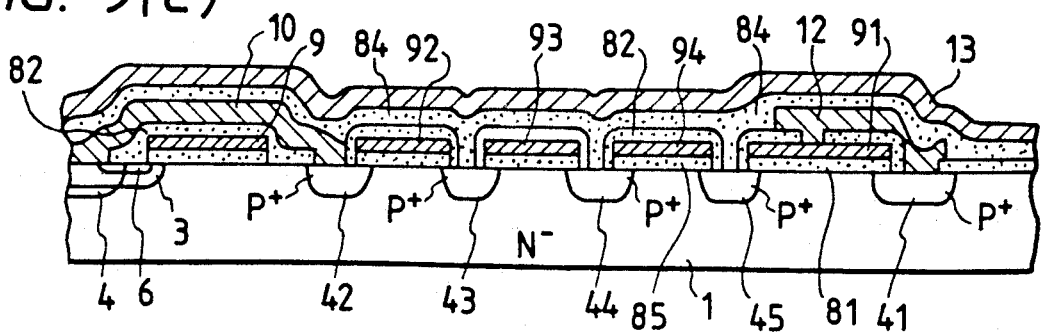

As shown in FIG. 9(a), P+ layers 4, 42, 43, 44 and 45 are formed in the surface of the N− silicon substrate by diffusing impurities using an oxide film 86 as a mask. Then, as shown in FIG. 9(b), an oxide film 80 is formed on the surface of the silicon substrate. The thickness of the oxide film 80 may be equal to that of the gate oxide film 81, ranging from 200 to 1000 Å. Next, as shown in FIG. 9(c), a polycrystalline silicon film is deposited and patterned to form the gate electrode 91 and the connecting electrodes 92, 93 and 94. P type base layer 3 is also formed. In the step shown in FIG. 9(d), the oxide film 80 is patterned into oxide films 81 and 85 with the polycrystalline silicon electrodes 9, 91, 92, 93 and 94 serving as a mask. After the N+ source layer 6 is formed, an oxide film is formed on the device thus treated, and is patterned to form the insulating films 82 respectively covering the electrodes. Finally, as shown in FIG. 9(e), the source electrode 10 in contact with the P+ layer 42, the peripheral electrode 12 in contact with the $P^{30}$ guard ring layer 41, the insulating film 84, and the signal line 13 are formed in the stated order.

In the device thus formed, with the connecting electrodes 92, 93 and 94 shielded, the effect of the signal line 13 on the signal voltage withstand is reduced to about one-tenth of the effect experienced in a conventional device. The capacitances $C_1$ through $C_7$ are determined by the degrees of overlap of the diffusion layers 42, 43, 44 and 45 with the electrodes 92, 93 and 94. The overlap of these components can be freely designed. By decreasing the thickness of the oxide film 81, the capacitances $C_1$ through $C_7$ can be increased and the effect of the signal line 13 can thereby be decreased. Accordingly, in a semiconductor device of the present invention, unlike the prior art device shown in FIG. 2, it is unnecessary to form the thick insulating film 83. It is, therefore, unnecessary to use the method of leaving the thick oxide by photolithography. With the oxide film 81 being formed with a thickness of 200 to 1000 Å, a withstand voltage of 160 to 800 V can be stably held between the P+ layer 42 and the P+ layer 41 at the drain potential.

Figure 10A:
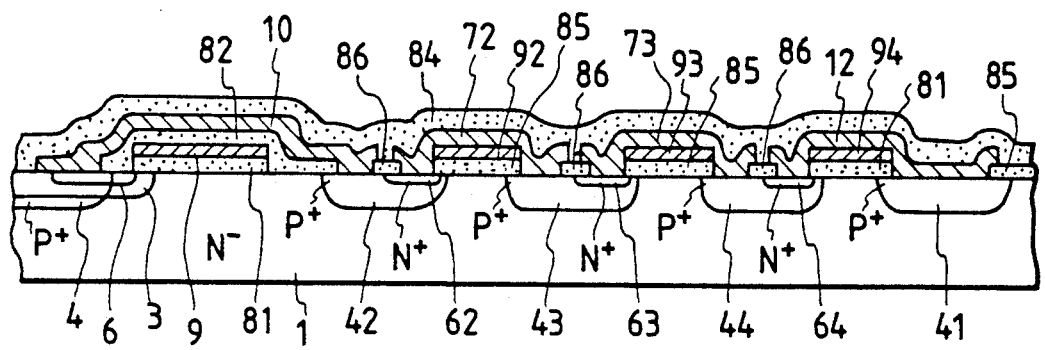
FIG. 10(a) is a sectional view showing a MOS type semiconductor device which is a second embodiment of the present invention.
Figure 10B:
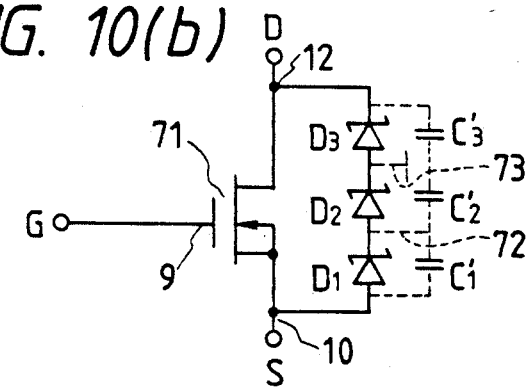
FIG. 10(b) is an equivalent circuit of the MOS type semiconductor device of the second embodiment.

FIGS. 10(a) and 10(b) show a vertical MOSFET or IGBT, according to a second embodiment of the present invention. In FIGS. 10(a) and 10(b) like parts which have been previously described with reference to FIG. 1 are designated with like reference numerals. The right side of FIG. 10(a) shows the structure of a guard ring edge portion of the element. As shown in FIG. 10(a), P+ layers 42, 43 and 44 are formed in the surface of the N− layer 1 between the base layer 3 and the guard ring layer 41, and N+ diffusion layers 62, 63 and 64 are formed in layers 42, 43 and 44, respectively. The P+ layer 42 is connected to the source electrode 10, the N+ layer 62 is connected through a connecting electrode 72 to the P+ layer 43, the N+ layer 63 is connected through a connecting electrode 73 to the P+ layer 44, and the N+ layer 64 is connected through the peripheral electrode 12 to the P+ layer 41. The N+ layers 62, 63 and 64, and the P+ layers 42, 43 and 44, thus form Zener diode PN junctions which are series-connected between the P+ layer 42 at the source potential and the P+ guard ring layer 41.

FIG. 10(b) shows an equivalent circuit of the device illustrated in FIG. 10(a) and described above, in which like parts are designated with like reference numerals. When the voltage applied to the series circuit of the Zener diodes $D_1$, $D_2$ and $D_3$ is lower than the breakdown voltage of the latter, it is divided by capacitances $C'_1$, $C'_2$ and $C'_3$ accompanying those Zener diodes, and the resultant potentials appear at the connecting electrodes 72 and 73, thus minimizing the effect of the signal line laid over the insulating film 84. However, when the drain potential, i.e., the potential of the peripheral electrode 12, becomes high, breakdown occurs in the Zener diodes, so that breakdown current flows between the source and drain of the FET 71, thus preventing the parasitic bipolar transistor from being turned ON.

FIGS. 11(a) through 11(e) show steps of forming the surface structure of the semiconductor device illustrated in FIG. 10(a). In FIGS. 11(a)-11(e), like parts which have been described with reference to FIGS. 10(a) and 10(b) are designated by like reference numerals.

Figure 11A:
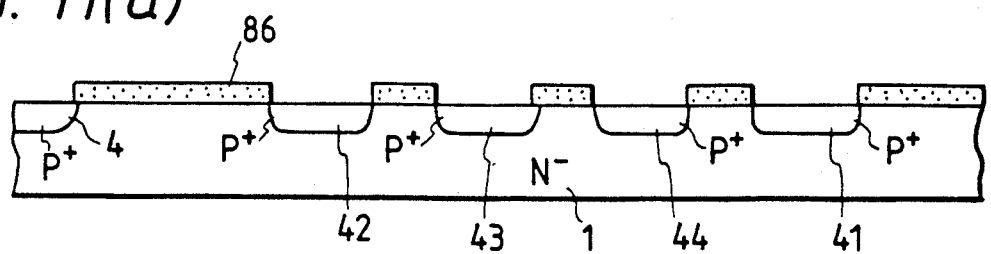
FIGS. 11(a) through (e) are sectional views showing a method of manufacturing the semiconductor device shown in FIG. 10.
Figure 11B:
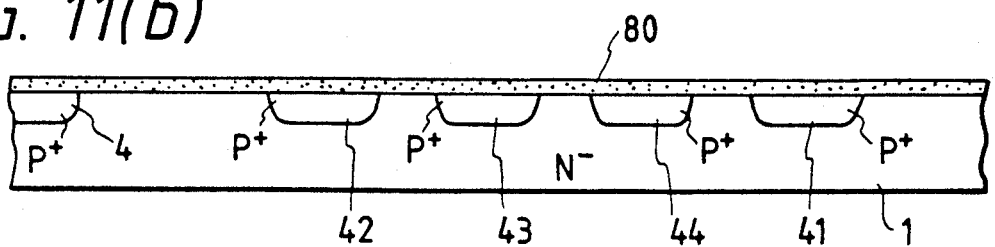
Figure 11C:
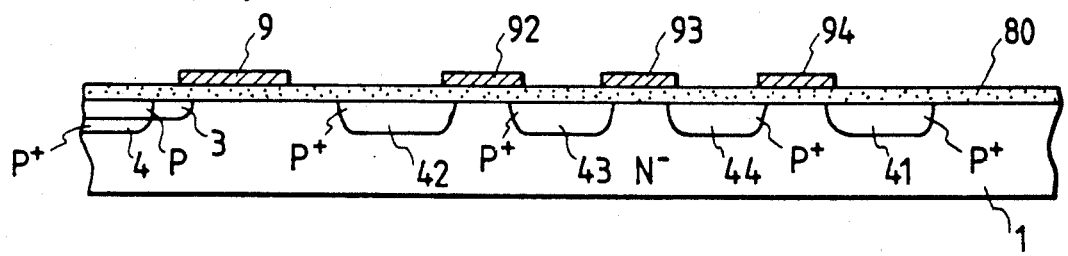
Figure 11D:
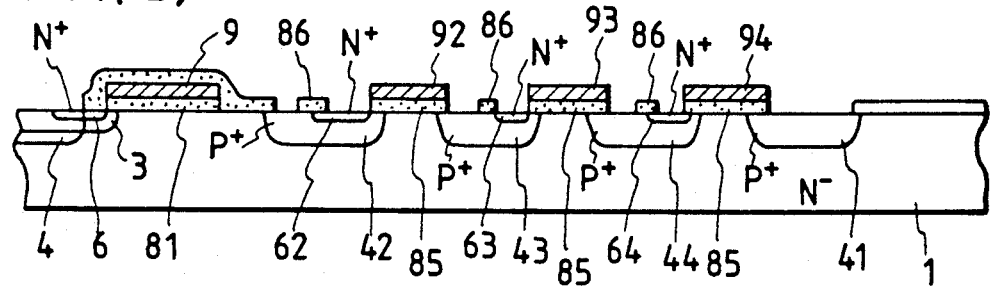
Figure 11E:
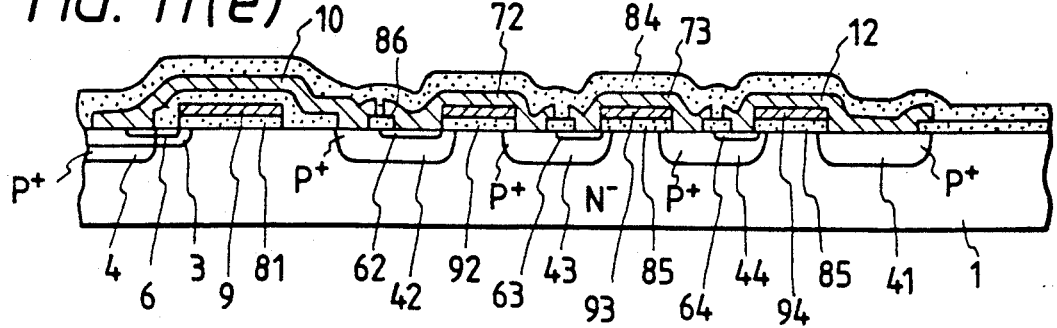

The manufacturing steps shown in FIGS. 11(a), 11(b) and 11 (c) are similar to those shown in FIGS. 9(a), 9(b) and 9(c). The P+ layers 4, 41, 42, 43 and 44, and the P layer 3 are formed in the surface of the N− layer 1, and the gate electrode 9 and the electrodes 92, 93 and 94, which are of polycrystalline silicon, are formed on the surface on the oxide film 80. In FIG. 11(d), the oxide film is patterned into oxide films 81, 85 and 86. Accordingly, the Zener diode cathode layers, constituted by the N+ layers together with the source layer 6, are formed with those oxide films and the polycrystalline silicon electrodes serving as a mask. As is apparent from the above description, the formation of the P+ layers 42, 43 and 44 and the N+ layers 62, 63 and 64 does not increase the number of manufacturing steps. Thereafter, as shown in FIG. 11(e), the source electrode 10, the peripheral electrode 12, the connecting electrodes 72 and 73, and the insulating film 84 covering those electrodes are formed. In the above-described embodiment, the polycrystalline silicon electrodes 92, 93 and 94 are left for patterning the oxide film 85. However, the semiconductor device may be manufactured without those electrodes, because it is unnecessary to precisely determine the positional relationships between the P+ layers 42, 43 and 44 and the N+ layers 62, 63 and 64.

In the manufacturing step shown in FIG. 11(a), the Zener voltage can be changed by adjusting the doping density of the P+ layers 42, 43 and 44. For instance, in the case where the doping density of the N+ diffusion layers 62, 63 and 64 is $10^{20}/cm^3$, Zener voltages 10 V, 20 V and 100 V can be obtained by setting the impurity densities of the P+ layers 42, 43 and 44 to $10^{17}/cm^3$, $10^{16}/cm^3$, and $10^{15}/cm^3$, respectively. With the P+ layers $10^{15}/cm^3$ in impurity density, the drain potential is clamped at 300 V, whereby the active part of the semiconductor device, on the left side of FIG. 10(a), is protected from damage.

Figure 12:
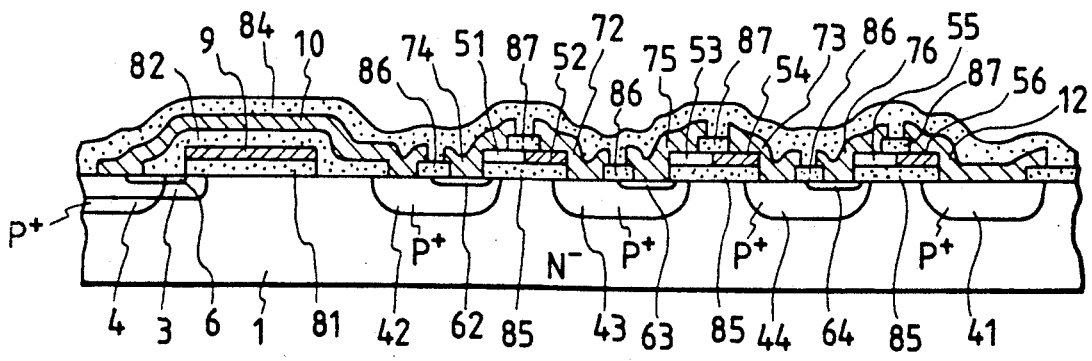
FIG. 12 is a sectional view showing a MOS type semiconductor device which is a third embodiment of the present invention.

FIG. 12 shows a third embodiment of the invention. In the third embodiment, in order to increase the number of series-connected Zener diodes, P+ regions 51, 53 and 55 and N+ regions 52, 54 and 56 are formed in a polycrystalline silicon layer on the insulating films 85 and are inserted between the diodes integrated in the N− layer 1. Connecting electrodes 74, 75 and 76 are formed in combination with the connecting electrodes 72 and 73, the peripheral electrode 12 and insulating films 87.

The structure of the device illustrated in FIG. 12 provides the following advantages. First, the number of series-connected diodes can be increased within a given area. Note that in FIG. 10 (a) the number of series-connected diodes is three, whereas in FIG. 12, six diodes are provided. Second, two kinds of Zener voltages can be formed. That is, the Zener voltages of the diodes made up of the P+ layer 42 and the N+ layer 62, the P+ layer 43 and the N+ layer 63, and the P+ layer 44 and the N+ layer 64 in the monocrystalline silicon substrate, as well as the Zener voltages of the diodes made up of the P+ region 51 and the N+ region 52, the P+ region 53 and the N+ region 54, and the P+ region 55 and the N+ region 56 in the polycrystalline silicon layer can be changed by adjusting the quantity of doping.

With respect to the third advantage, a monocrystalline silicon diode is small in junction leakage. Hence, the above-described structure can provide a bypass circuit which has less junction leakage and employs the Zener voltages of the polycrystalline silicon diodes.

Figure 13A:
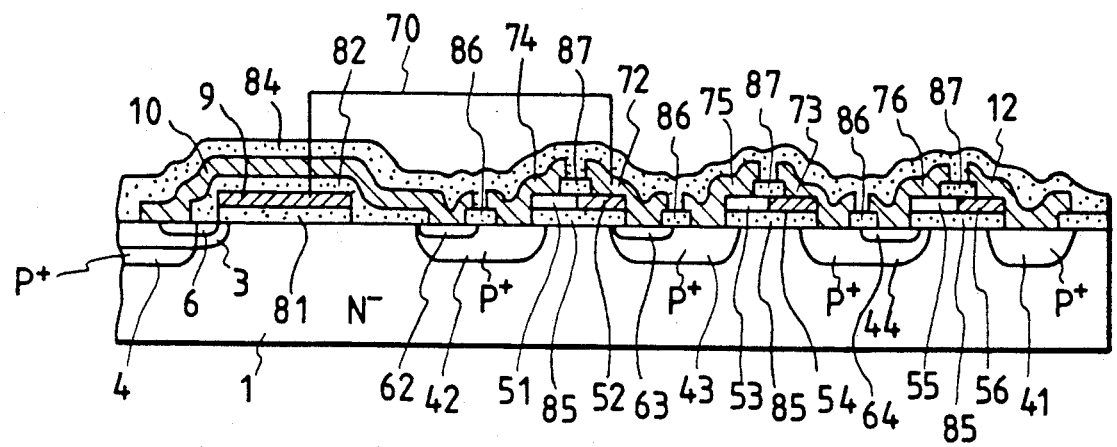
FIG. 13(a) is a sectional view showing a MOS type semiconductor device which is a fourth embodiment of the present invention.
Figure 13B:
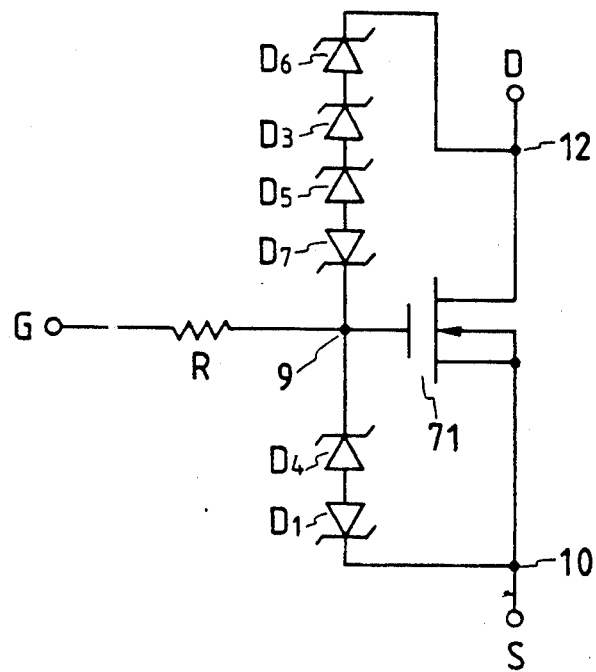
FIG. 13(b) is an equivalent circuit of the MOS type semiconductor device of the fourth embodiment.

FIG. 13(a) illustrates a fourth embodiment of the invention, and FIG. 13(b) illustrates an equivalent circuit thereof. Diode $D_1$ made up of the P+ layer 42 and the N+ layer 62, and the diode $D_2$ made up of the P+ layer 43 and the N+ layer 63, are anti-series-connected (opposite in polarity) to the diode $D_3$ made up of the P+ layer 44 and the N+ layer 64, and diodes $D_4$, $D_5$ and $D_6$ formed in the polycrystalline silicon layer. The N+ region 52 of the diode $D_4$ and the N+ layer 63 of the diode $D_2$ are connected through a conductor 70 to the gate electrode 9. In FIG. 13(b), reference character R designates the resistance between the gate terminal G and the gate electrode 9.

The case in which −10 V is applied to the gate terminal G to turn OFF the FET 71 is considered next. Since the diode $D_1$ is anti-series-connected, as described above, the potential of the gate electrode 9 becomes −10 V, such that the FET 71 is turned OFF, and the potential of the drain D is increased. As a result, breakdown occurs with the diodes $D_4$, $D_5$, $D_3$ and $D_6$, and current flows. The potential of the gate electrode 9 is increased and the FET 71 is turned ON, absorbing the power between the terminals S and D. The element is therby protected from damage.

Figure 14A:
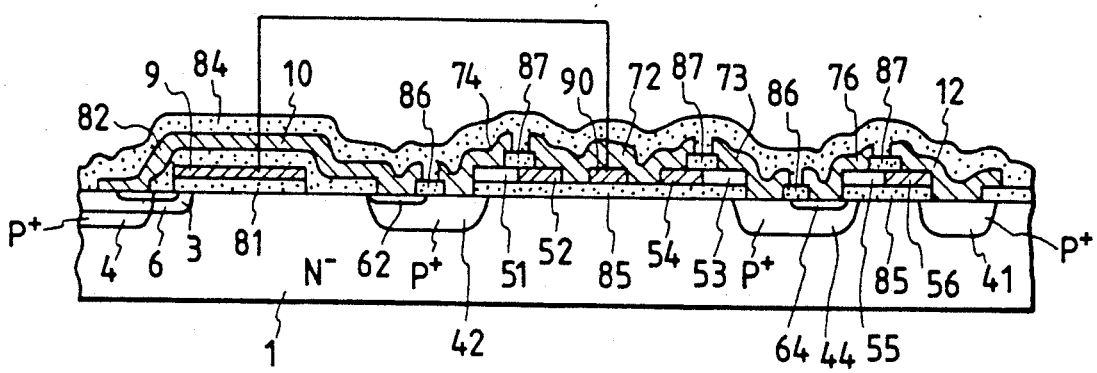
FIG. 14(a) is a sectional view showing a MOS type semiconductor device which is a fifth embodiment of the present invention.
Figure 14B:
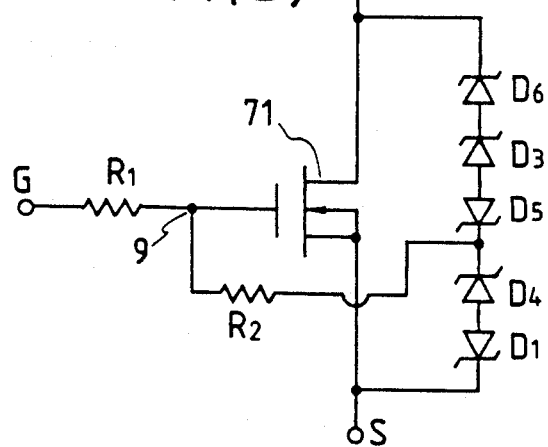
FIG. 14(b) is an equivalent circuit of the MOS type semiconductor device of the fifth embodiment.

FIG. 14(a) shows a fifth embodiment of the present invention. FIG. 14(b) shows an equivalent circuit of the semiconductor device of FIG. 14(a) which contains a voltage division point in a train of diodes connected through a resistor $R_2$ to the gate electrode. One of the train of diodes is anti-series-connected to the others. In the fourth embodiment described above, the gate voltage may be increased momentarily to a level which may damage the gate insulating film 81. In the fifth embodiment the voltage applied to the gate electrode 9 is adjusted by selecting the values of the resistances $R_1$ and $R_2$. The voltage applied to the gate electrode 9 can, therefore, be limited to an extent that the gate insulating film 81 is not damaged. The degree of design freedom is larger for the device of the fifth embodiment than for the fourth embodiment. The resistance $R_2$ is determined by the polycrystalline silicon layer 90 in a manner similar to that of the resistance determined by the gate electrode 9. The ratio $R_1/R_2$ can be obtained with high accuracy.

Figure 15:
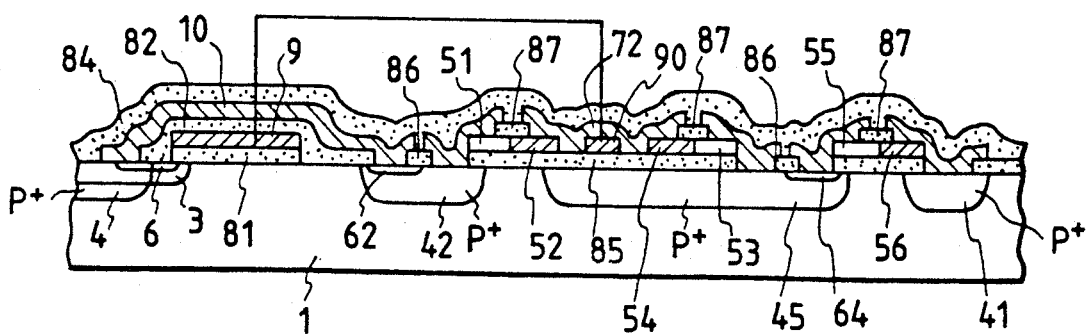
FIG. 15 is a sectional view showing a MOS type semiconductor device which is a sixth embodiment of the present invention.

FIG. 15 illustrates a sixth embodiment of the present invention which is a modification of the fifth embodiment. In the sixth embodiment, a diffusion layer 45 is formed under the oxide film 85, and the potential of the diffusion layer 45 is adjusted with respect to that of the resistance layer 90. In the case where, as shown in FIG. 13, the diffusion layers 42, 43 and 44 are relatively close to one another, the regions between the diffusion layers which are under the oxide films 85 are depletion layers, and therefore the drain voltage will not be applied directly to the oxide films. If, on the other hand, the spaces between the diffusion layers are relatively large, then damaging high voltage may be applied to the oxide films. This difficulty can be effectively eliminated by forming the diffusion layer 45 as shown in FIG. 15.

In the above-described fourth, fifth and sixth embodiments of the present invention, the gate electrode 9 is connected to the train of diodes, and the source-drain voltage is limited to the breakdown potential which protects the gate from damage.

Figure 16A:
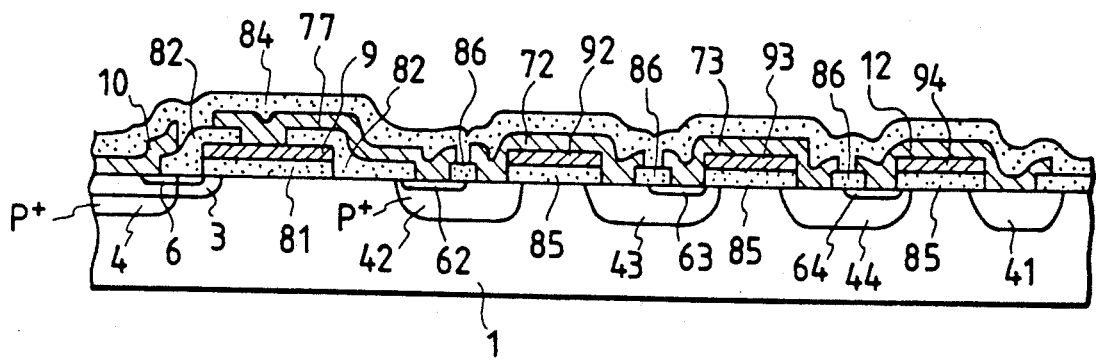
FIG. 16(a) is a sectional view showing a MOS type semiconductor device which is a seventh embodiment of the present invention.
Figure 16B:
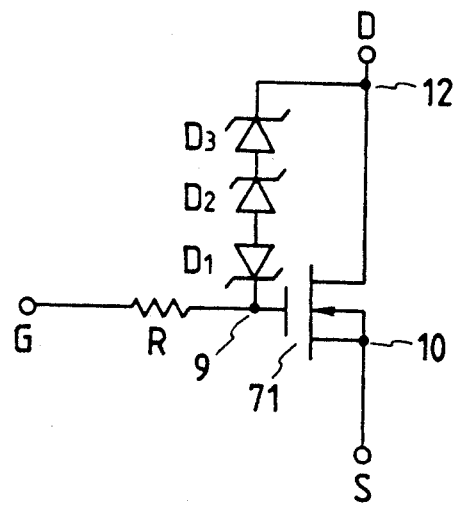
FIG. 16(b) is an equivalent circuit of the MOS type semiconductor device of the seventh embodiment.

FIG. 16(a) illustrates a seventh embodiment of the present invention. FIG. 16(b) illustrates an equivalent circuit of the device illustrated in FIG. 16(a(, in which one end of a train of three, series-connected diodes is connected through a connecting electrode 77 to the gate electrode 9. The resistance R between the gate electrode 9 and the gate terminal G is of the order of 1 to 10 Ω. When the semiconductor device is turned OFF, the potential of the terminal G is 0 V, or −5 to −10 V as the case may be. As the potential of the drain D increases, Zener current flows in the diodes. If it is assumed that 5A flows with R=3 Ω, then the potential of the gate electrode 9 becomes 10 V to 5 V, so that the semiconductor device is turned ON absorbing the power between the terminals S and D. Thus, the rise of the drain voltage is supported, and the difficulty caused by turning ON the parasitic transistor is eliminated. The semiconductor device is, thus, protected from damage. When it is required to increase the number of series-connected diodes, the polycrystalline silicon diodes on the substrate may be utilized similarly as in the third embodiment.

In the above-described first to seventh embodiments, the guard ring layer 41 is provided. However, it is not always necessary to provide the guard ring layer, that is, it may be omitted since a potential of the peripheral electrode 12 is equal to that of the drain electrode.

In the above-described second embodiment, the Zener diodes are made up of the PN junctions of the P+ layer 42 and the N+ layer 62, the P+ layer 43 and N+ layer 63, and the P+ layer 44 and the N+ layer 64, their breakdown voltage is determined by the impurity density and diffusion depth of the P+ layers 42, 43 and 44, and the controllable voltage is 100 to 200 V. However, it is sometimes necessary to protect the diodes from high voltage with a breakdown voltage higher than 500 V, for instance 1000 V. In order to meet this requirement according to the present invention as described with reference to the second embodiment or the third embodiment in which the Zener diodes on the substrate are utilized in combination, it is necessary for the semiconductor device to have a large area. The device is, therefore, costly to manufacture. This difficulty may be overcome in the eighth embodiment of the present invention which has a high breakdown voltage while nevertheless remaining small in area.

Figure 17:
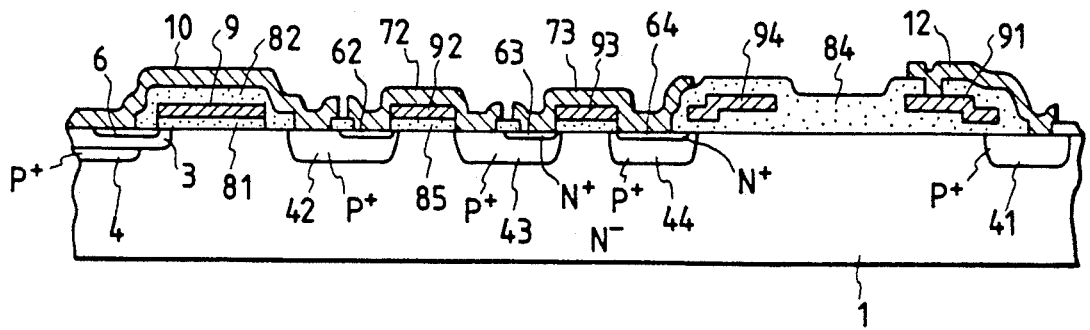
FIG. 17 is a sectional view showing a MOS type semiconductor device which is an eighth embodiment of the present invention.

The eighth embodiment of the present invention is illustrated in FIG. 17. Like parts of the seventh and eighth embodiments are designated by like reference numerals. The eighth embodiment differs from the seventh embodiment in that N+ layers 63 and 64 are connected to each other through the connecting electrode 73. Electrode 93 can, therefore, be eliminated. Formation of a gate electrode 94 over the channel region and the N+ layer 1 stabilizes the characteristic of the semiconductor device. The N+ layer 64, the P+ layer 44, and the N+ layer 1 form a base-open transistor. The base-open transistor together with two Zener diodes, which are formed by the N+ layer 62 and the P+ layer 42 and by the N+ layer 63 and the P+ layer 43, are series-connected between the source electrode 10 and the drain electrode formed on the lower surface of the N− substrate 1. This series connection provides a breakdown voltage of 800 to 1200 V. Similarly, as shown in FIG. 2, the edge portion has a guard ring layer 41 as a voltage withstanding means, a peripheral electrode 12, and a gate electrode 91.

Figure 18:
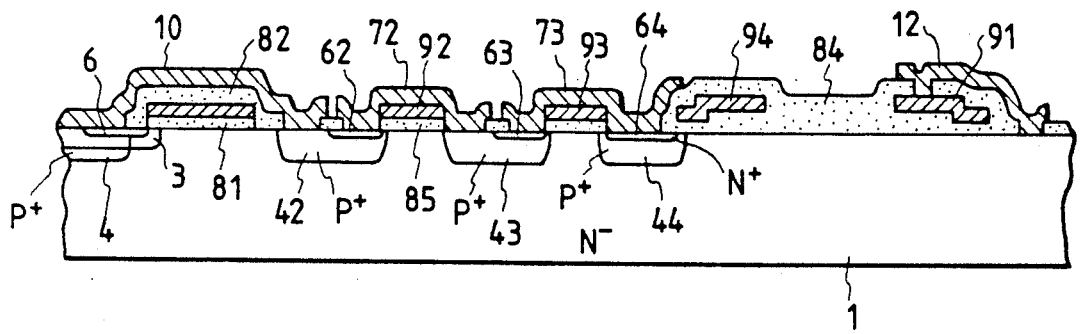
FIG. 18 is a sectional view showing a MOS type semiconductor device which is a ninth embodiment of the present invention.

FIG. 18 illustrates a ninth embodiment of the present invention. The ninth embodiment can be obtained by eliminating the P+ guard ring layer 41 from the semiconductor device illustrated in FIG. 17. However, the breakdown voltage of the ninth embodiment is equal to that of the eighth embodiment.

Figure 19:
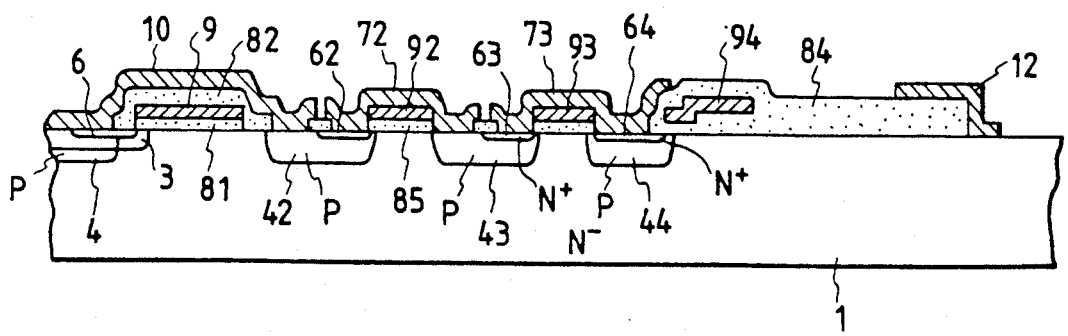
FIG. 19 is a sectional view showing a MOS type semiconductor device which is a tenth embodiment of the present invention.

FIG. 19 illustrates a tenth embodiment of the invention, which is a modification of the ninth embodiment shown in FIG. 18. In the tenth embodiment, the gate electrode 91 is also eliminated, and the insulating film 84 below the peripheral electrode 12 is increased in thickness. The tenth embodiment is substantially equal in characteristic to the ninth embodiment. In the tenth embodiment, the number of patternings is reduced, and the external appearance is improved.

Figure 20A:
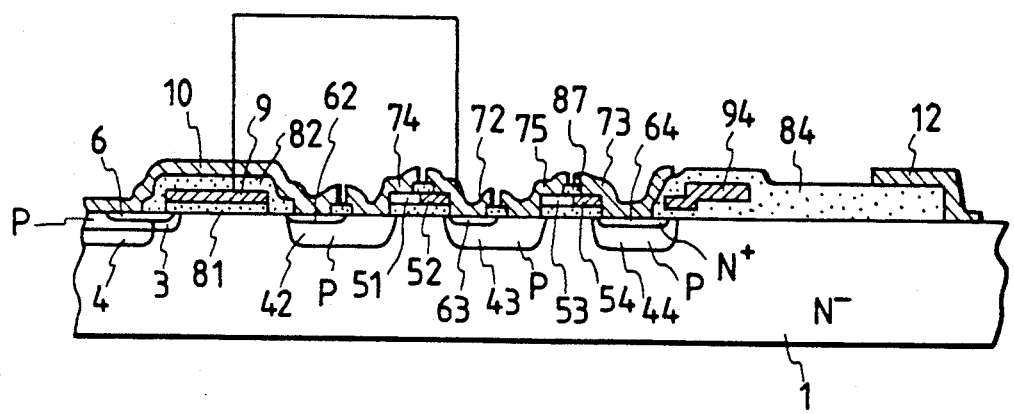
(FIG. 20(a) is a sectional view showing a MOS type semiconductor device which is a modified embodiment of that shown in FIG. 19, and FIG. 20(b) is an equivalent circuit of the MOS type semiconductor device of FIG. 20(a).
Figure 20B:
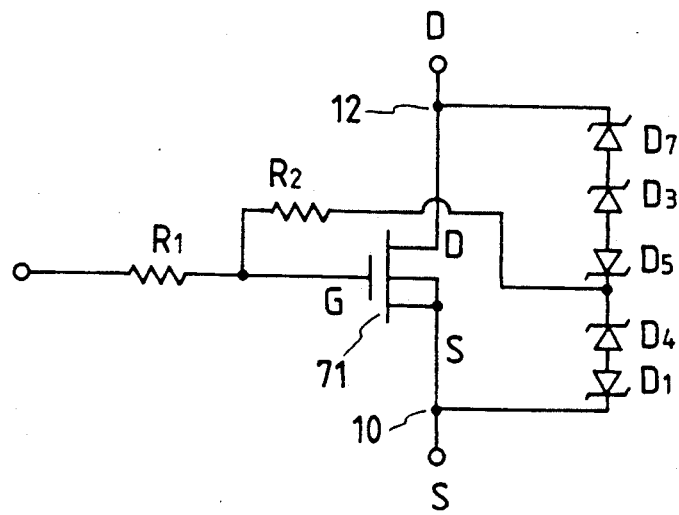

FIGS. 20(a) and 20(b) show a modified embodiment of MOSFET shown in FIG. 19. In FIG. 20(b), reference characters $D_1$, $D_3$, $D_4$ and $D_5$ designate similar Zener diodes. $D_7$ designates a base-open transistor. When current flows in the circuit, following breakdown of $D_3$, $D_4$ and $D_7$, voltage is fed back to the gate voltage. As a result, the FET 71 is rendered conductive (ON), absorbing the power between the source 10 and the drain 12.

While the present invention has been described with reference to N channel type semiconductor devices, it goes without saying that the technical concept of the invention can be equally applied to P channel type semiconductor devices.

In the MOS type semiconductor according to the present invention, a plurality of capacitors are formed near the surface of the substrate between the source electrode and the periphery electrode connected to the drain electrode in such a manner that the capacitors are series-connected between the source electrode and the peripheral electrode. This formation of capacitors eliminates the adverse effect on the surface of the substrate caused by the signal line being laid over the peripheral portion of the semiconductor device. In other words, the surface potential of the substrate is stabilized.

Furthermore, according to the present invention, series-connected constant voltage diodes are connected between the peripheral electrode and the source electrode. As a result, an increase of the drain voltage is suppressed, the parasitic transistor is prevented from being turned ON, and the semiconductor device is protected from damage. One end of the series circuit of constant voltage diodes, or the intermediate connecting point thereof, is connected to the gate. Hence, the gate is driven with the potential provided when breakdown of the constant voltage diodes occurs, and the MOS type semiconductor device is turned ON to absorb the power. Thus, even with constant voltage diodes of smaller capacity, the MOS type semiconductor device can be protected. Furthermore, the base-open transistor with the substrate as its collector is connected to one end of the train of constant voltage diodes such that it breaks down when the drain-source voltage increases. Thus, the device is protected from high voltage. Additional advantages and modifications will readily occur to those skilled in the art. The invention in its broader aspects is therefore not limited to the specific details, representative apparatus and illustrative examples shown and describe.

Accordingly, departures may be made from such details without departing from the spirit or scope of the applicants' general concept.

What is claimed is:

1. A MOS type semiconductor device, comprising:
   a semiconductor substrate including a first conductivity type semiconductor layer;
   a plurality of second conductivity type base layers selectively formed in a surface portion of the first conductivity type semiconductor substrate layer;
   a first conductivity type source layer selectively formed in a surface portion of said base layers;
   a gate insulating film formed over at least a portion of each said base layer;
   a gate electrode formed on the gate insulating film;
   a channel formed in a portion of said base layer beneath said gate electrode and between said source layer and said first conductivity type semiconductor substrate layer;
   a second conductivity type guard ring layer formed in said first conductivity type semiconductor substrate layer and disposed to surround said base layers;
   a source electrode formed on the surface of said first conductivity type semiconductor substrate layer and in contact with said base layer and said source layer;
   a peripheral electrode formed on the surface of said first conductivity type semiconductor substrate layer and in contact with said guard ring layer;
   a drain electrode formed on an opposite surface of said semiconductor substrate to have a potential substantially equal to that of said peripheral electrode;
   a plurality of second conductivity type layers formed in the surface of said first conductivity type semiconductor substrate layer between said source layer and said guard ring layer;
   a plurality of bridging insulating film portions each formed over the portion of said first conductivity type semiconductor substrate layer between adjacent ones of said second conductivity type layers and overlapping at least portions of said adjacent second conductivity type layers;
   a plurality of connecting electrodes respectively formed over said bridging insulating film portions; and
   a capacitance associated with each portion of each bridging insulating film portion that overlaps one of said second conductivity type layers, said capacitances being connected in series between said source electrode and said peripheral electrode by said plurality of connecting electrodes.

2. A MOS type semiconductor device, comprising:
   a semiconductor substrate including a first conductivity type semiconductor layer;
   a plurality of second conductivity type base layers selectively formed in a surface portion of the first conductivity type semiconductor substrate layer;
   first conductivity type source layer selectively formed in a surface portion of said base layers;
   a gate insulating film formed over at least a portion of each said base layer;
   a gate electrode formed on the gate insulating film;
   a channel formed in a portion of said base layer beneath said gate electrode and between said source layer and said first conductivity type semiconductor substrate layer;
   a second conductivity type guard ring layer formed in said first conductivity type semiconductor substrate layer and disposed to surround said base layers;
   a source electrode formed on the surface of said first conductivity type semiconductor substrate layer and in contact with said base layer and said source layer;
   a peripheral electrode formed on the surface of said first conductivity type semiconductor substrate layer and in contact with said guard ring layer;
   a drain electrode formed on an opposite surface of said semiconductor substrate to have a potential substantially equal to that of said peripheral electrode;
   a plurality of second conductivity type layers formed in the surface of said first conductivity type semiconductor substrate layer between said source layer and said guard ring layer;
   a plurality of bridging insulating film portions each formed over the portion of said first conductivity type semiconductor substrate layer between adjacent ones of said second conductivity type layers and overlapping at least portions of said adjacent second conductivity type layers;
   a plurality of connecting electrodes respectively formed over said bridging insulating film portions; and
   a plurality of first conductivity type layers formed in the plurality of second conductivity type layers to form a plurality of constant voltage diodes, said constant voltage diodes being connected in series between said source electrode and said peripheral electrode by said plurality of connecting electrodes.

3. A MOS type semiconductor device according to claim 2 wherein a connecting point between a pair of said plurality of constant voltage diodes is connected to said gate electrode, and at least one of said constant voltage diodes is opposite in polarity.

4. A MOS type semiconductor device, comprising:
   a semiconductor substrate including a first conductivity type semiconductor layer;
   a plurality of second conductivity type base layers selectively formed in a surface portion of the first conductivity type semiconductor substrate layer;
   a first conductivity type source layer selectively formed in a surface portion of said base layers;
   a gate insulating film formed over at least a portion of each said base layer;
   a gate electrode formed on the gate insulating film;
   a channel formed in a portion of said base layer beneath said gate electrode and between said source layer and said first conductivity type semiconductor substrate layer;
   a second conductivity type guard ring layer formed in said first conductivity type semiconductor substrate layer and disposed to surround said base layers;
   a source electrode formed on the surface of said first conductivity type semiconductor substrate layer and in contact with said base layer and said source layer;
   a peripheral electrode formed on the surface of said first conductivity type semiconductor substrate layer and in contact with said guard ring layer;

a drain electrode formed on an opposite surface of said semiconductor substrate to have a potential substantially equal to that of said peripheral electrode;

a plurality of second conductivity type layers formed in the surface of said first conductivity type semiconductor substrate layer between said source layer and said guard ring layer;

a plurality of bridging insulating film portions each formed over a portion of said first conductivity type semiconductor substrate layer between adjacent ones of said second conductivity type layers and overlapping at least portions of said adjacent second conductivity type layers;

a plurality of connecting electrodes respectively formed over said bridging insulating film portions; and a plurality of first conductivity type layers formed in the plurality of second conductivity type layers to form a plurality of constant voltage diodes, said constant voltage diodes being connected in series between said gate electrode and said peripheral electrode by said plurality of connecting electrodes.

5. A MOS type semiconductor device according to claim 4, wherein at least one of said constant voltage diodes is opposite in polarity.

6. A MOS type semiconductor device, comprising:

a semiconductor substrate including a first conductivity type semiconductor layer;

a plurality of second conductivity type base layers selectively formed in a surface portion of the first conductivity type semiconductor substrate layer;

a first conductivity type source layer selectively formed in a surface portion of said base layers;

a gate insulating film formed over at least a portion of each said base layer;

a gate electrode formed on the gate insulating film;

a channel formed in a portion of said base layer beneath said gate electrode and between said source layer and said first conductivity type semiconductor substrate layer;

a second conductivity type guard ring layer formed in said first conductivity type semiconductor substrate layer and disposed to surround said base layers;

s source electrode formed on the surface of said first conductivity type semiconductor substrate layer and in contact with said base layer and said source layer;

a peripheral electrode formed on the surface of said first conductivity type semiconductor substrate layer and in contact with said guard ring layer;

a drain electrode formed on an opposite surface of said semiconductor substrate to have a potential substantially equal to that of said peripheral electrode;

a plurality of second conductivity type layers formed in the surface of said first conductivity type semiconductor substrate layer between said source layer and said guard ring layer;

first conductivity type layers formed in said plurality of second conductivity type layers;

a first plurality of bridging insulating film portions each formed over a portion of said first conductivity type semiconductor substrate layer between adjacent ones of said second conductivity type layers and overlapping at least portions of said adjacent second conductivity type layers;

a second conductivity type region formed on a portion of each of said first plurality of bridging insulating film portions;

a first conductivity type region formed on a remaining portion of each of said first plurality of bridging insulating film portions and in contact with said second conductivity type region;

a a second plurality of bridging insulating film portions each formed over the junction of said second conductivity type region and said first conductivity type region formed one each of said first plurality of bridging insulating film portions;

a plurality of connecting electrodes respectively formed to connect in series a plurality of constant voltage diodes formed by said first conductivity type layers formed in said plurality of second conductivity type layers, and said second conductivity type regions formed next to said first conductivity type regions on said first plurality of bridging insulating fill portions between said source electrode and said peripheral electrode.

7. A MOS type semiconductor device according to claim 6, wherein a connecting point between a pair of said plurality of constant voltage diodes is connected to said gate electrode, and at least one of said constant voltage diodes is opposite in polarity.

8. A MOS type semiconductor device, comprising:

a semiconductor substrate including a first conductivity type semiconductor layer;

a plurality of second conductivity type base layers selectively formed in a surface portion of the first conductivity type semiconductor substrate layer;

a first conductivity type source layer selectively formed in a surface portion of said base layers;

a gate insulating film formed over at least a portion of each said base layer;

a gate electrode formed on the gate insulating film;

a channel in a portion of said base layer beneath said gate electrode and between said source layer and said first conductivity type semiconductor substrate layer;

a source electrode formed on the surface of said first conductivity type semiconductor substrate layer and in contact with said base layer and said source layer;

a peripheral electrode formed on the surface of said first conductivity type semiconductor substrate layer;

a drain electrode formed on an opposite surface of said semiconductor substrate to have a potential substantially equal to that of said peripheral electrode;

a plurality of second conductivity type layers formed in the surface of said first conductivity type semiconductor substrate layer between said source layer and said peripheral electrode;

a plurality of bridging insulating film portions each formed over the portion of said first conductivity type semiconductor substrate layer between adjacent ones of said second conductivity type layers and overlapping at least portions of said adjacent second conductivity type layers;

a plurality of connecting electrodes respectively formed over said bridging insulating film portions; and a capacitance associated with each portion of each bridging insulating film portion that overlaps one of said second conductivity type layers, said capacitances being connected in series between said source electrode and said peripheral electrode by said plurality of connecting electrodes.

9. A MOS type semiconductor device, comprising:
a semiconductor substrate including a first conductivity type semiconductor layer;
a plurality of second conductivity type base layers selectively formed in a surface portion of the first conductivity type semiconductor substrate layer;
a first conductivity type source layer selectively formed in a surface portion of said base layers;
a gate insulating film formed over at least a portion of each said base layer;
a gate electrode formed on the gate insulating film;
a channel formed in a portion of said base layer beneath said gate electrode and between said source layer and said first conductivity type semiconductor substrate layer;
a source electrode formed on the surface of said first conductivity type semiconductor substrate layer and in contact with said base layer and said source layer;
a peripheral electrode formed on the surface of said first conductivity type semiconductor substrate layer;
a drain electrode formed on an opposite surface of said semiconductor substrate to have a potential substantially equal to that of said peripheral electrode;
a plurality of second conductivity type layers formed in the surface of said first conductivity type semiconductor substrate layer between said source layer and said peripheral electrode;
a plurality of bridging insulating film portions each formed over the portion of said first conductivity type semiconductor substrate layer between adjacent ones of said second conductivity type layers and overlapping at least portions of said adjacent second conductivity type layers;
a plurality of connecting electrodes respectively formed over said bridging insulating film portions; and
a plurality of first conductivity type layers formed in the plurality of second conductivity type layers to form a plurality of constant voltage diodes, said constant voltage diodes being connected in series between said source electrode and said peripheral electrode by said plurality of connecting electrodes.

10. A MOS type semiconductor device according to claim 9 wherein a connecting point between a pair of said plurality of constant voltage diodes is connected to said gate electrode, sand at least one of said constant voltage diodes is opposite in polarity.

11. A MOS type semiconductor device, comprising:
a semiconductor substrate including a first conductivity type semiconductor layer;
a plurality of second conductivity type base layers selectively formed in a surface portion of the first conductivity type semiconductor substrate layer;
a first conductivity type source layer selectively formed in a surface portion of said base layers;
a gate insulating film formed over at least a portion of each said base layer;
a gate electrode formed on the gate insulating film;
a channel formed in a portion of said base layer beneath said gate electrode and between said source layer and said first conductivity type semiconductor substrate layer;
a source electrode formed on the surface of said first conductivity type semiconductor substrate layer and in contact with said base layer and said source layer;
a peripheral electrode formed on the surface of said first conductivity type semiconductor substrate layer;
a drain electrode formed on an opposite surface of said semiconductor substrate to have a potential substantially equal to that of said peripheral electrode;
a plurality of second conductivity type layers formed in the surface of said first conductivity type semiconductor substrate layer between said source layer and said peripheral electrode;
a plurality of bridging insulating film portions each formed over a portion of said first conductivity type semiconductor substrate layer between adjacent ones of said second conductivity type layers and overlapping at least portions of said adjacent second conductivity type layer;
a plurality of connecting electrodes respectively formed over said bridging insulating film portions; and
a plurality of first conductivity type layers formed in the plurality of second conductivity type layers to form a plurality of constant voltage diodes, said constant voltage diodes being connected in series between said gate electrode and said peripheral electrode by said plurality of connecting electrodes.

12. A MOS type semiconductor device according to claim 11, wherein at least one of said constant voltage diodes is opposite in polarity.

13. A method for forming a MOS type semiconductor device, comprising the steps of:
selectively diffusing a second conductivity type impurity into a surface of a first conductivity type silicon substrate to form second conductivity type layers;
forming a first oxide film on the surface of said silicon substrate;
depositing a polycrystalline silicon film on said first oxide film;
patterning said polycrystalline silicon film to form a gate electrode and a plurality of connecting electrodes;
patterning said first oxide film using said gate electrode and connecting electrodes as a mask;
forming a first conductivity type source layer in a selected one of said second conductivity type layers;
forming a second oxide layer on the surface of the silicon substrate to cover said gate electrode and said connecting electrodes;
forming a source electrode in contact with a first one of said second type conductivity type layers;
forming a peripheral electrode in contact with a peripheral one of said second conductivity type layers that is disposed to surround the other second conductivity type layers;
forming a third oxide layer to cover said second oxide layers and exposed portions of said second conductivity type layers; and
forming a signal line over said third oxide layer.

* * * * *

UNITED STATES PATENT AND TRADEMARK OFFICE
CERTIFICATE OF CORRECTION

PATENT NO. : 5,043,781
DATED : August 27, 1991
INVENTOR(S) : Masahiro Nishiura et al.

It is certified that error appears in the above-identified patent and that said Letters Patent is hereby corrected as shown below:

On the Title page, and in column 1, line 2, before " SEMICONDUCTOR" insert --MOS TYPE--.

Claim 2, column 11, line 62, before "first" insert --a--.

Claim 6, column 13, line 32, change "baselayers" to --base layers--.

Claim 6, column 13, line 48, before "source" change "s" to --a--.

Claim 6, column 14, line 10, change "a a" to --a--.

Claim 6, column 14, line 22, change "fill" to --film--.

Claim 8, column 14, line 41, after "channel" insert --formed--.

UNITED STATES PATENT AND TRADEMARK OFFICE
CERTIFICATE OF CORRECTION

PATENT NO. : 5,043,781

DATED : August 27, 1991

INVENTOR(S) : Masahiro Nishiura et al

It is certified that error appears in the above-identified patent and that said Letters Patent is hereby corrected as shown below:

Claim 10, column 15, line 56, change "sand" to --and--.

Signed and Sealed this

Twentieth Day of July, 1993

Attest:

MICHAEL K. KIRK

Attesting Officer   Acting Commissioner of Patents and Trademarks